United States Patent [19]

Afzali-Ardakani et al.

[11] Patent Number: 5,397,863
[45] Date of Patent: Mar. 14, 1995

[54] FLUORINATED CARBON POLYMER COMPOSITES

[75] Inventors: Ali Afzali-Ardakani, Yorktown Heights, N.Y.; Juan Ayala-Esquilin, San Jose, Calif.; Bodil E. Braren, Hartsdale; Shahrokh Daijavad, Peekskill, both of N.Y.; Elizabeth Foster, Friendsville, Pa.; James L. Hedrick, Jr., Oakland, Calif.; Jeffrey C. Hedrick, Peekskill, N.Y.; Rodney T. Hodgson, Ossining, N.Y.; Ashit A. Mehta, Vestal, N.Y.; Steven E. Molis, Brewster, N.Y.; Jane M. Shaw, Ridgefield, Conn.; Stephen L. Tisdale, Vestal, N.Y.; Alfred Viehbeck, Fishkill, N.Y.

[73] Assignee: International Business Machines Corporation, Armonk, N.Y.

[21] Appl. No.: 929,313

[22] Filed: Aug. 13, 1992

Related U.S. Application Data

[63] Continuation-in-part of Ser. No. 759,377, Sep. 13, 1991, abandoned, and a continuation-in-part of Ser. No. 759,380, Sep. 13, 1991, abandoned.

[51] Int. Cl.$^6$ ............................................. H05K 1/03
[52] U.S. Cl. ..................................................... 174/258
[58] Field of Search ................................. 174/258, 257

[56] References Cited

U.S. PATENT DOCUMENTS

| | | | |
|---|---|---|---|
| 4,036,786 | 7/1977 | Tiedemann | 252/511 |
| 4,332,880 | 6/1982 | Izu et al. | 430/272 |
| 4,855,361 | 8/1989 | Yaniger | 525/436 |

Primary Examiner—Leo P. Picard
Assistant Examiner—L. Thomas
Attorney, Agent, or Firm—Scully, Scott, Murphy & Presser

[57] ABSTRACT

Disclosed are structures comprising a composite of fluorinated particulate carbon dispersed in a polymer, the fluorinated carbon being present in an amount sufficient to reduce the dielectric constant of the composition, the structure also including electrical conductor patterns. The composite can be made conductive by irradiating it with an UV excimer laser.

17 Claims, No Drawings

FLUORINATED CARBON POLYMER COMPOSITES

REFERENCE TO PRIOR APPLICATIONS

This application is a continuation-in-part of application Ser. No. 07/759,377, filed Sep. 13, 1991, and is a continuation-in-part of application Ser. No. 07/759,380, filed Sep. 13, 1991.

TECHNICAL FIELD

The technical field of the invention is a process for making new polymeric composite materials containing fluorinated carbon reinforcements or fillers. The technical field of the invention also relates to a process for significantly changing the electrical and thermal properties of the polymer composite materials. The dielectric constant of the polymer composite materials can be lowered for use in electronic packaging applications or raised for use in thin film capacitors. Furthermore, the technical field of the invention relates to a method for reducing the thermal coefficient of expansion (hereafter "TCE") of the polymer material so that the materials can be coated onto substrates having lower TCE's than the unmodified polymers. The technical field of the invention also relates to a process for providing a conductive polymer composite material and especially for making selective areas of the surface conductive. Products obtained by the process are also described.

The process and the products, of the invention are useful in the manufacture of electronic components and electronic circuits such as integrated circuits, printed circuits and circuit boards.

The present invention relates to dielectric materials and more particularly to an improved dielectric composition, suitable for use in high performance electronic device packaging and printed circuit boards, and to methods for fabricating the improved dielectric.

PRIOR ART

Currently there are many uses for dielectric materials having a low dielectric constant, particularly printed circuit and packaging applications for electronic devices and computers. Widely used substrate materials for this purpose consist of fluoropolymer-glass composites such as disclosed in U.S. Pat. No. 4,849,284 to D. J. Arthur et al. As noted in that patent, the desirable features for a dielectric material in such applications are that it should hav a low dielectric constant, low electrical loss, low thermal expansion, and be chemically inert. Another important feature of such dielectric materials is the ability to form dielectric films which are uniform, nonporous, and possess high thermal stability. Further important qualities, not mentioned in the patent, are the susceptability to direct photoimaging of the composite material with a UV laser and laser ablation of a substrate of the material, both of which facilitate the making of very small via holes in the manufacturing of printed circuit boards.

Graphite or a substantially pure form of carbon having a graphitic laminar structure will form a series of compounds in which the graphite structure is retained and which are known in the art as graphite compounds. There are basically two types of these graphite compounds which are referred to as crystal compounds and covalent compounds.

The crystal compounds of graphite can be converted back to the graphite structure because the structure has not been altered to any great extent. These crystal compounds are usually dark colored and are described as lamellar compounds, interstitial compounds or intercalation compounds in that the reactants combine with the graphite in the region between the layers of carbon atoms that are typical in the graphite structure. It has been theorized that the intercalation reaction proceeds because the carbon atoms in the layers are more strongly bonded to one another with 7eaker bonds between the layers.

Intercalation can occur between each inter layer, alternate interlayers, every third interlayer and the like and typically can be based on alkali metal reactions with graphitic carbon or the reaction of various acids such as red fuming nitric acid, concentrated sulfuric acid and bromine vapor. The latter forms an intercalate $C_8Br$[12079-58-2] which is an electron acceptor in which the electrical resistance decreases, but the Hall coefficient changes from negative to positive. G. R. A. Henning, "Properties of Graphite Compounds," *Proceedings of the Second Conference on Carbon*, University of Buffalo, N.Y. 1956.

Unlike bromine intercalate compounds, fluorine forms covalent compounds with carbon. When fluorine reacts with amorphous forms of carbon such as wood charcoal it forms carbon tetrafluoride and other fluorocarbons. On the other hand the reaction of fluorine with high-purity carbon or graphite results in the production of polycarbon monofluoride having the formula $(CF_x)_n$ where x varies from about 0.07 to about 1.3. Ruff et al., *Z. Anorg. Chem.*, 217,1(1934); Lagow et al., U.S. Pat. No. 4,674,432; Kirk-Othmer, *Encyclopedia of Chemical Technology Third Edition*, V.10, p.637.

Chung, U.S. Pat. No. 4,546,892, describes the combination of a thermoset polyimide ("Skybond 700 TN," Monsanto Corp.) in combination with graphite flakes intercalated with bromine. Upon heat-curing the mixture, the intercalated graphite flakes are exfoliated, which is a sudden increase in the dimension of the flakes perpendicular to the carbon layers of the intercalated graphite thereby forming vermicular or wormlike shapes. The composite thus obtained may optionally be heated to carbonize the mixture which results in a composite with a resistivity lower than that of the original composite. A reduction of resistivity as high as a factor of six can be obtained.

Vogel et al., U.S. Pat. No. 4,414,142, describes a highly conductive composite of an organic polymer in combination with an intercalation compound of graphite. The intercalation compound is formed by reacting graphite with a Bronsted acid such as hydrogen fluoride and a metal halide such as $PF_5$, $AsF_5$ or $SbF_5$. The patentee notes that the composite has the mechanical properties of the organic polymer and that the electrical conductivity is increased by a factor of about 100. It is also noted that the conductivity of the composite can be significantly improved by the use of "p" type dopants such as $SbF_5$, $AsF_5$, bromine and iodine.

Homsy, U.S. Pat. No. 4,118,532, describes a composition for in vivo implantation consisting of perfluorinated high polymer in combination with a filler element such as fluorinated carbon particles.

Lyons et al., U.S. Pat. No. 4,691,091 describes a process for carbonizing a polymeric material followed by electroplating a metal on the carbonized surface.

Japanese Patent Application Kokai JP 60 115 622 (Chem. Abs., Vol. 103, 1985 161556w) is directed to an epoxy composition containing fluorinated carbon having excellent insulating properties and useful in sealing electronic parts. In the preferred embodiment, a cresol novolak epoxy resin is mixed with a fluorinated carbon material, a hardener, silica, wax, carbon black and a silane coupling agent followed by kneading, and cooling. The cool mixture is pulverized and employed as a molding powder which can be molded at 180° C. for about three minutes followed by post-curing at this temperature for eight hours.

NASA Case No. LEW-14472-1 which comprises subject matter available for licensing in accordance with 14 C.F.R. §1245.2 describes improved graphite fluoride fibers produced by a contact reaction between highly graphitized fibers and fluorine gas. The fibers are preferably intercalated with bromine or fluorine and methyl fluoride prior to fluorination. The graphite fluoride fibers are bound by an epoxy or alternatively polytetrafluoroethylene or a polyimide resin. The resulting composites have high thermal conductivity, high electric resistivity and high emissivity. The invention is further described in Hung, U.S. Pat. application Ser. No. 251,499, filed Sep. 30, 1988, now U.S. Pat. No. 4,957,661.

The use of polyimides in electronic packaging technology is widely known, the polyimide employed in this respect generally comprising the reaction product of pyromellitic dianhydride (hereafter "PMDA") and 4,4'-oxydiphenylenediamine (hereafter "ODA"). This polymer has most of the desired characteristics which are needed in packaging, namely very high temperature resistance (above 400° C.) and a low dielectric constant (ca 3.0-3.5) as well as good mechanical strength. Although adhesion to metals used in printed circuit boards and high-end packaging (such as copper, gold and the like) is poor it can be improved either by surface treatment of the polyimide film such as for example by plasma etching, and/or by introducing an adhesion promoting intermediate layer of chromium. Another factor which limits the use of this polyimide, especially in high wiring density packaging, is the thermal expansion mismatch of the polymer with metals (usually copper), semiconductor materials (such as silicon), and packaging materials such as glass or ceramic materials due to the relatively high TCE. The TCE of polyimide derived from PMDA-ODA is so high ($450 \times 10-7/°$ C.), that during the fabrication process of thin film packages where a thick polyimide film is bonded to silicon, glass ceramic or even alumina substrates either the substrate warps to an unacceptable level or the polyimide peels off or cracks.

The speed of electrical signals propagated along metal lines imbedded in a polymeric dielectric such as polyimide, fluoropolymer, or epoxy resin, is determined substantially by the dielectric constant of the polymeric material. Reducing the dielectric constant results in an increase in speed of such signals and a decrease in delay time between operation of devices connected by such metal lines.

It is at times advantageous to have an insulating material with high dielectric constant for use as dielectric material in capacitors. More energy can be stored if dielectric constant is larger.

When employing polyimides in electronic packaging or in the manufacture of circuit boards and especially printed circuit boards, it is also desirable to readily form conductive regions or lines for interconnecting circuit elements. Where several circuit boards are stacked and laminated to one another they are generally connected by through holes which are plated by a process known as through hole plating or PTH processes which are well known in the art. Where the circuit boards comprise composites of polyimides and fiber reenforcing materials (e.g. glass fibers) the polyimide surface has to be chemically treated or "roughened" prior to forming the conductive regions or lines. These conductive regions or lines are generally formed by an electroless coating process comprising the application of a zerovalent palladium catalyst in combination with a protective tin colloid which adheres to the treated polyimide surface after which an electroless metal coating solution comprising a metal salt in combination with an aldehyde reducing agent is applied. The colloidal palladium activates the aldehyde reducing agent and thereby converts the dissolved metal salt, such as copper sulfate, to solid copper metal. These electroless coatings are further built up by subsequent electrolytic metal coatings, again all of these processes being well known in the art.

The difficulties with the electroless coating of polymeric surfaces such as polyimide surfaces is not only the surface preparation required but also the multiple cleaning and rinsing steps involved in the application of the electroless coating as well as the subsequent processing steps required for building the electrolytic coating.

Accordingly, it is an object of the present invention to overcome these and other difficulties encountered in the prior art.

It is accordingly an object of the present invention to provide a dielectric material offering an optimal combination of low dielectric constant, low thermal coefficient of expansion and low porosity. Another object of this invention is to provide a dielectric material which can undergo UV laser ablation under very low fluences (as low as 1 J/cm$^2$) so as to result in openings or vias with very smooth and nearly vertical side walls after the laser drilling thereof. Still another object of this invention is to provide a dielectric material which after exposure to very low UV laser dosage becomes partially conductive and thus can be used in the repair of opens in electrical circuit lines of a printed wiring board or high density packaging.

It is also an object of the invention to provide a process for effecting a change of the physical properties of a polyimide material.

It is a further object of the present invention to provide a process for reducing the TCE and dielectric constant of polymeric materials, e.g. polyimide, fluoropolymer, epoxy, polymerized bismaleimides, polymerized benzocyclobutenes, polycyanurates, polysiloxanes, polybenzimidazoles, polybenzoxazoles, polyphenylquinoxalines, and blends thereof.

It is another object of the present invention to provide a process for reducing the dielectric constant of a polymeric material.

It is a further object of the invention to provide a process for increasing the dielectric constant of a polymer composite material.

It is a further object of the present invention to provide a process for forming an electrically conductive polymeric composite material from a non-conductive polymeric composite material.

It is also an object of the invention to provide a process for forming at least one conductive region in a polymeric composite material adjacent to a non-conductive region in such polymeric composite material.

It is a further object of the present invention to provide a process for electrolytically forming a metal coating on a polymeric composite material where the polymeric composite material has not been coated with an electroless metal coating.

It is the further object of the invention to provide novel products produced by the aforesaid processes.

SUMMARY OF THE INVENTION

These and other objects have been achieved according to the present invention which is a structure comprising a substrate formed from a dielectric material comprising:

a composite of a fluorinated carbon material dispersed in a material having a dielectric constant;
said fluorinated carbon material being present in an amount sufficient for said composite to have a dielectric constant less than said dielectric constant of said material;
said substrate including electrical conductor patterns.

The material having a dielectric constant is preferably a polymeric material, such as polyimide, fluoropolymer, or epoxy or other thermoset and thermoplastic polymeric materials. Such structures are suited for electrical interconnection with one or more electronic devices such as capacitors, resistors, switches and the like.

Another aspect of the present invention is compositions of matter comprising a fluorinated particulate carbon material dispersed in a polymer material, the fluorinated carbon material being present in an amount sufficient to substantially reduce the TCE of the polymer and in an amount also sufficient to substantially change the dielectric constant of the composition.

In one embodiment of the present invention a structure comprises a polyimide composite made by dispersing from about 2% to about 50% by weight of a fluorinated carbon which is made by the direct fluorination of carbon powder with fluorine, and containing fluorine in an amount up to about 75 atomic weight percent fluorine in a solution of a polyimide precursor e.g. a polyamic acid in NMP (N-methylpyrrolidone) solvent. Coupling agents such as organo silicons or organo titanates can be employed to enhance the dispersion of the fluorinated carbon in the polyimide solution. The mixture is coated onto a substrate by spin coating or doctor blade, the substrate comprising a silicon wafer, a metal film such as a copper film or ceramic packaging module. The film is dried and cured at a high temperature to obtain a fully imidized polyimide-fluorinated carbon composite.

A composite may also be made from a soluble and fully imidized polyimide such as Polyimide XU 218 TM Ciba Geigy Co. or soluble polyetherimides.

Polyimide XU 218 is a polyimide based on diaminophenylindane (DAPI) and benzophenone dianhydride (BTDA) and is further described Polyimides edited by Feger et al. Elsevier (1989) p. 497 et seq. and Bateman et al. U.S. Pat. 3,856,752 both of which are incorporated herein by reference including the references cited therein.

Where soluble polyimides are employed the fluorinated carbon can be dispersed in a solution of such polyimide or polyetherimide in a solvent and then coated on to a substrate and dried at temperatures above the boiling point of the solvents. No high temperature curing of this film is necessary.

The polyimide-fluorinated carbon composites have a micro-roughness which increases their adhesion to metals by increasing the mechanical interlocking of the metals to the composite surface. Because the surface of the composite is rich in fluorine, the composites will have a higher contact angle with water which helps to prevent or reduce the under cutting of metal lines in high humidity or upon immersion in aqueous solutions employed in subsequent processing steps.

When the foregoing polyimide composite is coated onto a silicon substrate and cured, it can be subsequently irradiated with a UV excimer laser, the electrical resistivity of the exposed area decreases from $10^{15}$ to $10^1$–$10^4$ ohm/cm. The exposed area can be electroplated with copper which will produce copper plating on the exposed area to form electrical conductor patterns, thereby eliminating many of the processing steps in coating polyimides with an electroless metal followed by applying an electrolytic metal coating. It will be recognized that electronic devices such as resistors, capacitors, integrated circuits, and the like can be electronically interconnected with such patterns.

In another embodiment of the present invention a structure comprises a composite dielectric material comprised of a fluoropolymer, such as polytetrafluoroethylene (PTFE), and fluorinated carbon (FC), e.g., in the form of fluorinated carbon powder, fluorinated graphite or fluorinated coke. This material, like that in which the polymeric material is polyimide or epoxy, is suitable for various uses, among them being the fabricating of printed circuit boards on which electrical conductor patterns are formed in accordance with the procedures described herein and other techniques known in the art. In this regard this material has advantages over other dielectric materials for that purpose in that it has a low dielectric constant, very low porosity, good adhesion to metal, and is easier to ablate with an excimer laser than such previous materials.

In another embodiment of this invention, a structure comprises a composite dielectric material comprised of an elastomeric polysiloxane and fluorinated carbon particles at a loading of 2 to 60% by weight. This structure provides a lower dielectric constant than the unfilled elastomeric materials while retaining substantial elongation with increased modulus. This composite material can be used as a dielectric layer and interconnect structure in high density electronic packaging applications. As an example, a vinyl terminated poly(-dimethyldiphenylsiloxane) is filled from about 2 to 60% by weight with fluorinated carbon particles and cured by hydrosilation. For example, a composite comprised of poly(dimethylsiloxane) and 20% by weight fluorinated carbon particles has about a 150% elongation at break and has a high tensile strength and modulus.

In fabricating the improved dielectric material using a fluoropolymer, the fluoropolymer (which is preferably PTFE, typically in the form of a slurry), and the fluorinated carbon may be made into a composite material by suitable mixing followed by processing involving, for example, heating, milling, calendaring, or direct thin film coating. In one exemplary process, the respective consitutents, e.g., Teflon 30, 30B, or 35, sold by E.I. dupont de Nemours Co. (DuPONT), and Acuuflor 2065 or 1030, sold by Allied Signal Co. (ALLIED), are mixed in selected proportions, coated on a heat resistant (e.g., copper) substrate and baked at high pressures (100–2000 psi) and temperature (up to about 390° C.), followed by slow cooling to room temperature. The proportions are selected such that the resulting film preferably has a fluorinated carbon content in this application of 2 to 50% by weight.

Another approach for making the composite film is to mix aqueous Teflon with fluorinated carbon and then vigorously agitate the mixture, such as by high speed stirring or ball milling, until the Teflon particles and fluorinated carbon are co-coagulated to form a mass, which is separated from supernatant water and rinsed several times with deionized 7ater. This mass may be calendered between two steel rolls at high pressure several times until a uniform thin film is obtained. The resulting free standing film may be laminated between two copper sheets at 200–1500 psi and high termperature (355°–380° C.) to form a dark gray composite with a low dielectric constant and a high tensile strength. This film, when containing 50% fluorinated carbon, has optimum physical, electrical and thermal properties and will undergo laser ablation at very low fluence resulting in the formation of openings with smooth side walls having a steep angle.

In a further process, other fluoropolymers, such as (perfluoroalkoxy)fluorocarbon resin, e.g., DuPONT's Teflon PFA, may be used to make composites with fluorinated carbons. In such case, Teflon PFA pellets and fluorinated carbon powder may be mixed thoroughly in a blender and the mixture melt extruded to a free standing composite which like that of the preceding approach may be laminated between two copper sheets.

Still another approach to making a Teflon-fluorinated carbon composite in accordance with the invention is to use a soluble fluoropolymer such as co-polytetrafluorethylene perfluorodioxole, e.g., DuPONT's Teflon AF, in a fluorinated hydrocarbon solvent to which the fluorinated carbon, e.g. Accufluor 2065 (ALLIED) is added. The mixture may be ball milled until a uniform dispersion results. The dispersed mixture may then be filtered and let down with about 8% Teflon AF solution to samples with various desired final ratios of Teflon AF to fluorinated carbon and coated on different substrates (e.g., copper, polyimide etc.) and dried at 120° C. The resulting composites with different fluorinated carbon loading (e.g., from 2 to 60%) will all have a very low dielectric constant and be laser ablated at a very low fluence.

In another embodiment, a structure comprises fluorinated carbon particles dispersed in an epoxy binder. The weight ratio of fluorinated carbon to epoxy is sufficient to lower the dielectric constant of the composite without adversely affecting the mechanical properties of the composite. Typically, that weight ratio is 10 to 30 wt. %.

DETAILED DESCRIPTION OF THE INVENTION

The present invention is directed to a structure one aspect of which comprises a composite of a fluorinated particulate carbon material dispersed in a material having a dielectric constant.

The fluorinated carbon material comprises by way of example, ACCUFLUOR, (TM) 2065, 3000, 1030 Allied Signal Co. which are produced by direct fluorination of carbon powder, graphite powder or coke respectively. The properties of such fluorinated particles are described by Mathew H. Luly in J. Mater. Res. 3, 890–898 (1988) and the references therein all of which are incorporated herein by reference.

Fluorinated carbons (FC) are the product of direct fluorination of carbon powder graphite, or coke, and can have a wide range of fluorine to carbon ratios, e.g., a fluorine content of 10% to 70%, and hence a wide range of electrical resistivity, such as 1 to $10^{12}$ ohm/cm. The FCs of this invention have preferably a fluorine content between 30 and 70%, an electrical resitivity between $10^{10}$ to $10^{12}$ ohm/cm, and temperature resistance of 500°–650° C. The FC is preferably fluorinated carbon powder, such as ALLIED's Accufluor 1030, 2056, or 3000. However, both the PTFE and FC's may each involve mixtures or combinations of their specified constituents.

One suitable polymeric material is polyimide, a polymeric material which comprises a polyamic acid polyimide precursor or a substantially imidized polyimide i.e. a polyamic acid that has been substantially imidized to a polyimide or a solvent soluble polyimide such as polyimide XU 218, TM or soluble polyetherimides.

In addition to the PMDA-ODA polyimides that may be employed according to the present invention, those based on bis-(phenylene dicarboxylic acid) anhydride and p-phenylenediamine (hereafter BDA-PDA) can be employed as well as those based on benzophone tetracarboxylic acid dianhydride and 1,3-bis-(aminophenoxy) benzene (hereafter BTDA-APB).

The various art known-polyimides which can be used according to the invention, are further described in Kirk-Othmer, *Encyclopedia of Chemical Technology*, Third Edition (Vol. 18, pp.704–719), Dunphy et al., U.S. Pat. No. 3,770,573; Lindsey, U.S. Pat. No. 3,361,589; Goff, U.S. Pat. No. 4,416,973; Fyrd et al., U.S. Pat. No. 4,551,522; Araps et al., U.S. Pat. No. 4,871,619 columns 3-6 including polyisoimides and THERMID, TM; Roark et al., U.S. Pat. No. 4,859,530 describing fluorinated polyimides, which along with THERMID polyimides are useful in adhesive applications; and Higuchi et al., *Chem. Mater.*, 1991, 3, 188–94 and all of the references cited in each of the aforementioned references, all of which are incorporated herein by reference.

As noted, the polyimide composite is made by dispersing from about 20% to 50% by weight of a fluorinated carbon having a fluorine/carbon atomic ratio up to about 1.3 (about 75 atomic weight %) in a solution of the polyimide precursor or the soluble polyimide e.g. a polyetherimide, a polyisoimide or a polyamic ester in a suitable solvent. Fluorinated carbons $CF_x$ where $X = 0.07$, 0.25 and 1.2 (10, 28 and 64 atomic wt. percent fluorine) are especially suitable, especially those fluorinated carbons having from about 28 to about 64 atomic percent fluorine.

Various coupling agents that may be employed to enhance the dispersion of the fluorinated carbon in the polyimide solution comprise those based on organo silicon or organo titanate compounds known in the art.

The various silicon and titanate compounds that may be employed in this regard are as follows:
trimethylchlorosilane
dimethyldichlorosilane
hexamethyldisilazane
chloromethyldimethylchlorosilane
N,N'-bis(trimethylsilyl)urea
N-trimethylsilyldiethylamine
N-trimethylsilylimidazole
N,O-bis(trimethylsilyl)trifluoroacetamide
N-methyl-N-trimethysilyltrifluoroacetamide
t-butyldimethylsilylimidazole
N-trimethylsilylacetamide
trimethylsilyl iodide methylchlorosilanes
octadecyltrichlorosilane
octyl-,phenyl-,cyclohexyl-,or ethylsilanes
(3,3,3-trifluoropropyl)trimethoxysilane
[3-(2-aminoethyl)aminopropyl]trimethoxysilane
cyanoethyltrimethoxysilane
aminopropyltriethoxysilane
phenyltrimethoxysilane
(3-chloropropyl)trimethoxysilane
(3-mercaptopropyl)trimethoxysilane
(3-glycidoxypropyl)trimethoxysilane
vinyltris($\beta$-methoxyethoxy)silane
(-methacryloxypropyl)trimethoxysilane
[-($\beta$-aminoethylamino)-propyl]trimethoxy silane
vinylbenzyl cationic silane
(4-aminopropyl)triethoxysilane
[-glycidoxypropyl)trimethoxysilane
[$\beta$-(3,4-epoxycyclohexyl)-ethyl]trimethoxysilane
($\beta$-mercaptoethyl)trimethoxysilane
(-chloroproDyl)trimethoxysilane
octadecyl-3-(trimethoxysilyl)propylammonium chloride
methylaminopropyltrimethoxysilane
3-(trimethoxysilyl)propyldimethyloctadecylammonium
chloride
N-(3-silylpropyl)-p-nitrobenzamide Examples of titanate coupling agents of the present invention include:
  isopropyltridodecylbenzene sulfonyl titanate
  isopropyltris(dioctylpyrophosphate) titanate
  bis(dioctylpyrophosphate) oxyacetate titanate
  bis(dioctylpyrophosphate) ethylene titanate
  isopropyltri(dioctylphosphate) titanate
  isopropyltri(N-aminoethyl) titanate
and mixtures thereof.

As noted previously the TCE of polyimides derived from PMDA-ODA is about 450×10-7/c and when a thick polyimide is employed in thin film packaging by bonding the polyimide to silicon, glass ceramic or even an alumina substrate, such substrate will warp to an unacceptable level or the polyimide peels or cracks. The fluorinated carbon material is employed in an amount effective to reduce the TCE by any where from about 20% to about 90% and especially from about 60% to about 80% where the polyimide film is from about 1 $\mu$m to about 100 $\mu$m and especially from about 5 $\mu$m to about 20 $\mu$m.

Similarly, the amount of fluorinated carbon employed in the composites of the present invention is such that the dielectric constant can be reduced from any where from about 5% to about 40% and especially from about 10% to about 25%.

When a film is formed from either a polyimide precursor such as polyamic acid (or esters thereof) or from a preimidized soluble polyimide, (or polyisoimide) heated to 150°–250° C. to remove the solvent, and irradiated with light from a UV excimer laser, with a wavelength of 248 or 308 nm, the exposed surface area becomes electrically conductive and can be electroplated by techniques well known in the art.

In those applications where the polyimide composite is employed in a circuit board, through holes in the board can be rendered conductive by exposing them to radiant energy as described herein. These through holes can then be electroplated by techniques known in the art.

Additionally, the composites of the present invention may be used as coatings on substrates, especially microelectronic substrates as a dielectric layer, and after application the surface of the composite can be rendered conductive as described herein in order to form surface conductive regions on the substrate. These conductive regions may be produced as described herein by irradiating the substrate through a mask in contact with the substrate or projecting the light transmitted through a mask onto the substrate by techniques that are known in the art. Alternatively, the coating may be screened on the substrate in a pattern, and the coating surface may be rendered conductive by uniform irradiation with an UV excimer laser.

When a radiant energy source is used such as a UV excimer laser, a fluency from anywhere about 10 mJ/cm$^2$ to about 100 mJ/cm$^2$ and especially from about 20 mJ/cm$^2$ to about 50 mJ/cm$^2$ at a repetition rate from about 2 Hz to about 300 Hz and especially from about 20 Hz to about 100 Hz.

The wave length of the UV light can be anywhere from about 193 nm to about 350 nm and especially from about 248 nm to about 308 nm. The wave length, fluency and repetition rate are variables that will depend on the polyimide, and amount and nature of the fluorinated carbon all of which are variables that can be readily adjusted within the foregoing ranges by a person with ordinary skill in the art.

It has also been discovered according to the present invention that when polyimide precursors such as polyamic acid are used to form the composite materials of this invention, if the temperature is raised slowly to the normal curing temperature for polyimides (400° C.) the composite material will exhibit a higher dielectric constant.

In order to obtain the high dielectric constant composites, with the dried polyimide composite, it is heated slowly to temperatures from room temperature (about 20° C.) to about 350° to about 450° C. and especially from about 380° to about 400° C. for a period of time from about 10 to about 12.0 minutes and especially from about 40 to about 80 minutes. Slow heating comprises heating at a rate of from about 5° to about 45° C. per minute, and especially from about 10° to about 35° C. per minute.

When preimidized soluble polyimides or polyisoimides are used to form the composite materials of this invention, after substrate coating and solvent evaporation the dielectric constant of the composite is low and does not change appreciably upon raising the temperature to 400° C. Also, if the composite material is formed from polyimide precursor such as polyamic acid and heated at low temperature (about 150° to about 200° C.) to remove the solvent, and subsequently heated rapidly (within about 2 to about 30 seconds) to a high temperature of 400° C. the resulting polyimide composite material exhibit low dielectric constant. These heating rates therefore will be from about 65° to about 220° C. per second and especially from about 75° to about 125° C. per second.

Thus, by the expedient of adjusting the curing time and temperatures the composites of the present invention can be converted into high dielectric constant materials.

The exposure temperature and time depends on film thickness which again will be anywhere from about 1 $\mu$m to about 100 $\mu$m and especially from about 5 $\mu$m to about 20 $\mu$m.

The following examples are illustrative.

EXAMPLE I

Accufluor 2CFx 2065 (TM, Allied Signal Co.) (3.5 grams) was added to 70.0 grams of a 10% solution of soluble polyimide XU 218 in NMP containing 0.2 grams organotitanate coupling agent KRTTS (Kenrich Chemical Co.) and the mixture was milled for one hour in a glass jar using glass media on a Red Devil shaker. The milled mixture was then separated from the media and let down with various amounts of the polyimide solutions to make mixtures of from 10 phr (parts by weight fluorinated carbon per hundred parts by weight polyimide) to 50 phr and each coated on an aluminum substrate to a thickness of 25–50 microns. The samples were dried and heated at 250° C. for 2 hours. The dielectric constant of the samples decreases as the percentage of the fluorocarbon in the composite increases as noted in Table I.

TABLE I

| phr Accufluor | dielectric constant |
|---|---|
| 0 | 4 |
| 20 | 3.7 |
| 30 | 3.55 |
| 40 | 3.21 |

Upon further heating of these samples to 400° C., no appreciable change of dielectric constant was observed.

EXAMPLE II

Accufluor 2065 TM (5.7 grams) was added to a solution of 16.0 grams polyimide 2065 precursor polyamic acid derived from PMDA-ODA in 264 grams NMP solvent. Then 2.5 grams of 4% LICA 12 organotitante [neopentyl(diallyl)oxy,tri(diocty') phosphatotitanate] coupling agent was added and the mixture was stirred for half an hour and then milled using glass media for one hour. The milled mixture was let down with additional polyamic acid solution to get 20 phr and 40 phr samples. The samples were then coated on an aluminum substrate, dried at 90° C. for 2 hours and then cured in a vacuum oven at 250° C. for two hours.

The dielectric constant was measured and the following results obtained:

TABLE II

| phr Accufluor | Dielectric Constant |
|---|---|
| 0 | 3.52 |
| 20 | 3.13 |
| 40 | 2.61 |

After measurement, the temperature of these samples was raised to 400° C. at the rate of 3° C./minute, and kept at 400° C. for one hour and cooled to room temperature. The data in Table III were obtained.

TABLE III

| Accufluor phr | Dielectric Constant |
|---|---|
| 0 | 3.5 |
| 20 | 18.2 |
| 40 | 65.6 |

EXAMPLE III

A polyimide composite with fluorinated carbon (Accufluor 2065, TM Allied Signal Co.) was made by dispersion of the fluorinated carbon from 10–15% by wt. in polyamic acid derived from PMDA-ODA solution in NMP and coating the latter on a silicon substrate and curing. The composite was then irradiated with an UV excimer laser. In this example, the wavelength of the UV light was 308 nm, the fluency was 30 mJ/cm$^2$ and the repetition rate was 20 Hz. The exposed areas, with 50 micron width, exhibited a resistance of 2400 /hms when probes were placed 5 mm apart on the surface of the exposed lines.

The wavelength, fluency and repetition rate are all variables that depend on the polyimide, percent and nature of fluorinated carbon. In the next step the exposed sample was subjected to a standard copper sulphate electroplating bath at 5–50 mA which resulted in plating of the exposed area with copper. The polyimide-based substrate was thereby directly and selectively patterned with metals with high resolution and good adhesion of the metal to polymer. This approach takes less time than the existing methods in the fabrication of thin film packages.

EXAMPLE IV

A dispersion of 20 phr Accufluor 2065 in a solution of polyamic acid derived from PMFD-ODA was prepared according to the procedure of Example II. After coating on a substrate and driving off the solvent at 200° C. for 2 hours, the substrate was heated on a 400° C. hot plate for 2 seconds. The Fourier transform infrared spectrum showed that the resulting film was almost fully (greater than 98%) imidized. The dielectric constant of the film was measured to be 3.2, very little different from the dielectric constant of a similar film cured at 250° C. as in Example II, Table II, and quite different from the film heated slowly to 400° C. as shown in Table III of Example II.

In another embodiment of the present invention, a structure comprises a substrate which comprises a composite dielectric material of a fluoropolymer, preferably polytetrafluoroethylene (PTFE), in which is dispersed fluorinated carbon (FC). Such a composite may be prepared using a combination of mixing and heating to achieve an end product of constituent proportions in the range of as low as 2% and up to 80% of fluorinated carbon to fluoropolymer by weight, and having a low dielectric constant and other improved properties as will be described. Preferably, the PTFE is an aqueous dispersion of Teflon, such as of DuPONT Teflon 30, Teflon 30B, or Teflon 35, or is melt processable, like (perfluoroalkoxy) fluorocarbon resin or co-polytetrafluoroethylene perfluorodioxole, e.g., DuPONT Teflon PFA or AF 1600, respectively.

Various processes may be carried out to form suitable fluoropolymer-fluorinated carbon composites in accordance with this embodiment of the invention. To begin with, a process generally illustrating the steps to be followed in carrying out a typical implementation of the invention will be set forth.

EXAMPLE V

Approximately 7.0 gms of a water soluble wetting agent, e.g., ROHM & HAAS's Triton X-100 or BASF Wyandotte's Pluronic P-104, are added to 200.0 grams of deionized water and stirred until all the agent is dissolved. To this solution is added 250.0 grams of FC, e.g., Accufluor 1030 (ALLIED) and the mixture is stirred well until a uniform dispersion is obtained. To this mixture is added an aqueous slurry of Teflon, e.g., DuPONT's Teflon 30, Teflon 30-B, or Teflon 35, the amount of which is based on the desired final ratio of Teflon to fluorinated carbon, ranging in this instance from about 20 to 80%. The mixture is stirred and finally a small amount (0.1 to 2%) of thickening agent, e.g., B. F. GOODRICH's Carbopol 954 or BASF's Pluronic F127, is added and stirring continued until a viscous dispersion with viscosity of about 200 to 500 cps is obtained. This final mixture is coated by conventional methods on a copper substrate, dried at room temperature to remove the water and baked at 285°-310° C. to remove all the surfactant and thickener. The coated substrate is then laminated under high pressure, e.g., in a range from 100 to 2000 psi, and at high temperature, e.g., from 360° to 390° C., and cooled down slowly to room temperature. The dielectric constants of a number of composites made according to the foregoing procedure were measured and found to vary between 2.4 to 2.8, depending upon the percent of fluorinated carbon in the composite, i.e., from 20 to 80%, respectively, for the samples measured.

Another approach for making these composites is to mix aqueous Teflon with fluorinated carbon and then vigorously agitate the mixture, such as by high speed stirring or ball milling, until the Teflon particles and fluorinated carbon are co-coagulated to from a mass. An actual experiment in this regard was carried out as follows.

EXAMPLE VI

To 200 grams of Teflon 35 (DuPONT) was added 60 grams of Accufluor 1030 (ALLIED) and the mixture was stirred at 2000 rpm. After a few minutes, the Teflon and fluorinated carbon co-coagulated to form a mass which was separated from supernatant water and rinsed several times with deionized water. The off-white coagulum was calendered between two steel rolls at high pressure (500–1500 psi) several times until a uniform thin film 0.02 to 0.05 mm thick was obtained. This free standing film was laminated between two copper sheets at 200–1500 psi and high temperature (355°–380° C.) to form a dark gray composite which had a dielectric constant of 2.3 and tensile strength of about 2000 psi. Just as samples prepared according to Example V, this film, which contained about 50% fluorinated carbon, underwent laser ablation at very low fluence (less than 1 J/cm$^2$) resulting in the formation of openings with smooth side walls having a steep angle.

Alternatively, other fluoropolymers, such as DuPONT's Teflon PFA, may be used to make composites with fluorinated carbons in accordance with the invention. In such cases, Teflon PFA pellets and fluorinated carbon powder may be mixed thoroughly in a blender or directly in a hot melt extruder and the molten mixture melt extruded to a free standing composite which like that of the preceding example could be maintained between two copper sheets. Teflon AF may also be a suitable fluoropolymer in this process.

Still another approach to making a Teflon-fluorinated carbon is to use soluble Teflons, such as Teflon AF, according to the following example.

EXAMPLE VII

To 200 grams of 8% Teflon AF-1600 (DuPONT) in a fluorinated hydrocarbon solvent (3M's Fluorinert FC-70 in this case) was added 16.0 grams of Accufluor 2065 (ALLIED) and the mixture was ball milled until a uniform dispersion resulted. The dispersed mixture was filtered and let down with about 8% Teflon AF solution to samples with various desired final ratios of Teflon AF to fluorinated carbon and coated on different substrates (e.g., copper, polyimide etc.) and dried at about 120° C. The resulting composites with different fluorinated carbon loading (from 2% to 40%) all had a very low dielectric constant (2.15–2.2) and were laser ablated at a very low fluence of about 0.3 J/cm$^2$. It was noted, however, that while the ablation improved with reduced fluorinated carbon content, the coefficient of thermal expansion of the film increased.

By way of comparison with the prior art, an experiment was carried out using a mixture of silica and fluorinated carbon fillers to form the composite with Teflon. Although these composites were found to have very similar thermal, electrical, and mechanical properties, to conventional Teflon-glass, still the presence of small amount, as little as 5%, of fluorinated carbon increased the UV laser etch rate of the composite at lower fluences over that of corresponding Teflon-silica composites. The experiment was carried out of follows.

EXAMPLE VIII

To 120.0 grams of deionized water, containing 5.0 grams of Pluronic P-104 wetting agent, were added 120.0 grams of amorphous silica (IMSOL Co.'s A-108-H) and 30.0 grams of Accufluor 1030 and the mixture was stirred until a uniform dispersion resulted. This mixture was then mixed and stirred with 250 grams of aqueous Teflon 30 slurry and finally 400 mg. of Carbopol 954 (GOODRICH) was added and stirring continued until a viscous mixture was obtained. The resulting mixture was coated on a copper substrate to a dry thickness of 0.01–0.5 mm and processed further in accordance with the latter steps set forth in Example V. The final composite of this example consisted of 50% Teflon PTFE, 40% silica, and 10% fluorinated carbon and had a dielectric constant of 2.9.

While this constant is similar to that of the prior art 50% glass in Teflon PTFE, the composite underwent laser ablation at about half the fluence as, and at a higher etch rate than, Teflon-glass. Alternatively, ceramic particles, such as of Al$_2$O$_3$, may be used as well as amorphous silica in this process. However, silica is preferred for its lower dielectric constant, and in a proportion of from about 5% to 45% by weight.

TABLE I presents a comparison of the physical properties of three different Teflon composites, i.e., a Teflon-fluorinated carbon composite with 47% FC by weight prepared by thin film coating, a Teflon-fluorinated carbon composite with 47% FC by weight prepared by co-coagulation and calendering, and a Teflon-glass composite with 50% by weight of glass. It will be seen from the Table that the composites formed in the manner of the present invention have a lower dielectric constant than the Teflon-glass. Also, FIG. 1 shows that such composites are laser ablated at lower fluence with higher etch rate than Teflon-glass, which typically requires a very high fluence of the order of 10–15 J/cm$^2$. Accordingly, based on tests carried out on the composites described above, especially the Teflon PTFE-fluorinated carbon composites, it was discovered that the thermal resistance and mechanical properties of these Teflon-fluorinated carbon composites are similar to those of the prior art Teflon-glass composite, but there are three distinct improvements over the latter which can be summarized as follows:

1. Dielectric constant

As mentioned in connection with Example VII, a composite can be fabricated having a dielectric constant as low as 2.15 as compared to 2.9 for Teflon-glass composites. Further, using the simplified thin film coating and baking procedure described, the dielectric constants (2.6–2.7) of the final composites (TABLE I) are also lower than those of the corresponding Teflon-glass composites of the prior art.

2. Porosity

The porosity of the carrier substrate for high density printed wiring boards or advanced packaging technology is very important because in the fabrication of these boards or packages there is exposure to electroless or electrolytic metal plating baths containing metal cations and ionic species which can permeate a porous substrate and adversely change the electrical properties of the dielectric substrate. Sodium ion diffusion tests were performed on Teflon-glass and on Teflon-fluorinated carbon composites in accordance with the present invention and showed that the latter are far less porous than the Teflon-glass composite.

3. Laser Ablation

Laser ablation of polymer composites has become a method of choice for formation of through vias in the fabrication of high density packages. In the case of Teflon-glass composites of the prior art, since none of the constituents of the composite have appreciable UV absorption, UV laser ablation of this material must be carried out at very high fluence, typically 10–15 J/cm$^2$. This results in vias having very rough walls with relatively low angles, which is undesirable. The present Teflon-fluorinated carbon composites, on the other hand, undergo laser ablation at very low fluence, typically below 1 J/cm$^2$, and high etch rate, which results in smooth via walls with large angles.

As noted, the advantages of the present invention can also be realized when the polymeric material is an epoxy. The fluorinated carbon is dispersed in the epoxy binder, a catalyst (curing agent) is added in a small but effective amount typically on the order of up to 0.5% by weight of the mixture, and the resulting mixture is coated onto e.g. a woven glass substrate. The dry thickness of the coating is about 0.05–0.10 mm. The coated glass is dried in air, and then heated to a temperature (typically 130° C.–150° C.) effective to crosslink the epoxy binder. A circuit board can be prepared by preparing several layers in this way, laminating them together at high temperature and pressure, and then metallizing the exterior surface and forming electrically conductive patterns on the surface.

The epoxy can be based on any cross-linkable starting material containing the characteristic epoxy group also known as 1, 2-epoxide or oxirane. One typical epoxy is the diglycidyl ether of bisphenol A, having the formula:

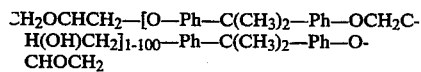

wherein each Ph is para-substituted phenyl. Alternatively, the bisphenol can be replaced by polyols such as aliphatic or cycloaliphatic glycols. The curing agents are typically anhydrides, amines, or polyamides. Other useful epoxies include bisphenol F; the tetraglycidyl ethers of tetrakis (4-hydroxyphenyl) ethane; triglycidyl p-aminophenol resins; N, N, N', N'-tetraglycidyl-4, 4'-diaminodiphenylmethane; and those formed by glycidylation of difunctional or polyfunctional polyols such as 1,4-butanediol, 2,2'-dimethyl-1,3-propanediol, polypropylene glycols, glycerol, trimethylolpropane, or pentaerythritol.

More specifically, expoxies useful in this invention include,

It has also been found that exposing a substrate of the composite material made in the manner of the present invention to UV excimer laser radiation at a fluence of 50 to 250 mJ/cm$^2$ results in partial defluorination of the fluorinated carbon which renders the exposed area of the substrate somewhat electrically conductive, i.e., $10^3$–$10^4$ ohm/cm. This property can be used for repair of broken conductor lines in a printed circuit board by photoimaging the open area with an UV laser and then electroplating the exposed area with copper.

It will therefore be seen that in accordance with the present invention a dielectric material is presented offering an optimal combination of low dielectric constant, low thermal coefficient of expansion and low porosity, that can undergo UV laser ablation under very low fluences (of the order of 1 J/cm$^2$) to produce openings or vias with very smooth and near vertical side walls after the laser drilling thereof. Further, this dielectric material after exposure to very low UV laser dosage becomes partially conductive and thus can be used in the repair of opens in electrical circuit lines of a printed wiring board or high density packaging.

TABLE 1

| Physical Properties of Teflon Composites | | | | |
|---|---|---|---|---|
| Composite | % Strain | Stress | Modulus | Er |
| 47% FC. (T) | 9.8 | 2024 | 217000 | 2.6 |
| 47% FC. (C) | 14.4 | 2130 | 243000 | 2.3 |
| Teflon-glass | 4.8 | 2280 | 389800 | 2.9 |

Notes:
(a) Stress and modulus are given in pound/in$^2$.
(b) (T) is Teflon-fluorinated carbon (FC) composite with 47% by weight FC prepared by thin film coating.
(c) (C) is Teflon-FC composite with 47% FC prepared by co-coagulation and calendering.
(d) Teflon-glass composite had 50% by weight glass.
(e) E$_r$ stands for dielectric constant.

Although the invention has been described by reference to some embodiments, it is not intended that the novel process or the products obtained be limited thereby but that modifications are intended to be included as falling within the broad scope and spirit of the foregoing disclosure and the following claims.

Having thus described our invention, what we claim as new, and desire to secure by Letters Patent is:

1. A structure comprising a substrate formed from a dielectric material comprising:
   a composite of a fluorinated particulate carbon material dispersed in a polymeric material having a dielectric constant wherein said fluorinated particulate carbon material contains 28 to 75 atomic weight % of fluorine;
   said fluorinated particulate carbon material being present in an amount sufficient for said composite to have a dielectric constant less than said dielectric constant of said polymeric material;
   said substrate including electrical conductor patterns.

2. The structure of claim 1, wherein said polymeric material is selected from the group consisting of thermoset, thermoplastic, and elastomeric polymeric material and combinations thereof.

3. The structure of claim 2, wherein said polymeric material is selected from the group consisting of polyimide, fluoropolymer, epoxy, polycyanurate, polysiloxane, polybenzocyclobutene, polyquinoxaline and bismaleimides.

4. The structure of claim 1, further including an electronic device which is electronically interconnected with said electrical conductor patterns.

5. The structure of claim 3 where said polyimide material is a substantially imidized polyimide.

6. The structure of claim 3 where said polyimide material is formed from material selected from the group consisting of polyamic acids and esters of polyamic acids.

7. The structure of claim 6 wherein said polyimide material is selected from the group consisting of PMDA-ODA, BPDA-PDA and BPDA-APB.

8. The structure of claim 3 where said polyimide material comprises a solvent soluble polyimide.

9. The structure of claim 3 where said polyimide material comprises a solvent soluble polyetherimide.

10. The structure of claim 3 where said polyimide material comprises a polyisoimide.

11. A structure comprising a substrate formed from a dielectric material comprising:
a composite of a fluorinated particulate carbon material dispersed in a polymeric material having a dielectric constant;
said fluorinated carbon material being present in an amount sufficient for said composite to have a dielectric constant less than said dielectric constant of said polymeric material;
said substrate including electrical conductor patterns;
wherein said polymeric material is a thermoset, thermoplastic, or elastomeric polymeric material which is selected from the group consisting of polyimide, fluoropolymer, epoxy, polycyanurate, polysiloxane, polybenzocyclobutene, polyquinoxaline and bismaleimides;
said structure further comprising a coupling agent in an amount sufficient to enhance the dispersability of said fluorinated carbon material in said polymeric material.

12. The structure of claim 11 wherein said coupling agent is selected from the group consisting of organo silicon compounds and organo titanium compounds.

13. A structure comprising a substrate formed from a dielectric material comprising:
a composite of a fluorinated particulate carbon material dispersed in a polymeric material having a dielectric constant;
said fluorinated carbon material being present in an amount sufficient for said composite to have a dielectric constant less than said dielectric constant of said polymeric material;
said substrate including electrical conductor patterns;
wherein said polymeric material is a thermoset, thermoplastic, or elastomeric polymeric material which is selected from the group consisting of polyimide, fluoropolymer, epoxy, polycyanurate, polysiloxane, polybenzocyclobutene, polyquinoxaline and bismaleimides;
wherein said composite substantially comprises fluorinated carbon particles dispersed in a fluoropolymer with the fluorinated carbon to fluoropolymer being in the range of 2% to 60% by weight.

14. The structure of claim 13 wherein said fluoropolymer is a material selected from the group consisting of polytetrafluoroethylene, (perfluoroalkoxy) fluorocarbon resin, co-polytetrafluoroethylene perfluorodioxole, and combinations thereof.

15. The structure of claim 13 wherein said fluorinated carbon particles are of a material selected from the group consisting of fluorinated carbon particles, fluorinated graphite particles, fluorinated coke particles, and combinations thereof.

16. The structure of claim 13 further comprising silica in the range of 5% to 45% by weight.

17. The structure of claim 13 wherein said fluorinated carbon particles have a fluorine content in the range from 30% to 70%.

* * * * *